United States Patent [19]

Cambou et al.

[11] Patent Number: 5,064,781
[45] Date of Patent: Nov. 12, 1991

[54] METHOD OF FABRICATING INTEGRATED SILICON AND NON-SILICON SEMICONDUCTOR DEVICES

[75] Inventors: Bertrand F. Cambou, Mesa; H. Ming Liaw; Mamoru Tomozane, both of Scottsdale, all of Ariz.

[73] Assignee: Motorola, Inc., Schaumburg, Ill.

[21] Appl. No.: 576,543

[22] Filed: Aug. 31, 1990

[51] Int. Cl.$^5$ ............................................. H01L 21/18
[52] U.S. Cl. ..................................... 437/132; 437/234
[58] Field of Search ...................... 437/132, 234, 134; 148/DIG. 56

[56] References Cited

U.S. PATENT DOCUMENTS

| | | | |
|---|---|---|---|
| 4,261,781 | 4/1981 | Edmonds et al. | 437/226 |
| 4,774,205 | 9/1988 | Choi et al. | 437/132 |
| 4,826,784 | 5/1989 | Salerno | 437/132 |
| 4,925,810 | 5/1990 | Kano | 437/132 |

FOREIGN PATENT DOCUMENTS 0005649 1/1984 Japan ..................................... 437/132

Primary Examiner—Olik Chaudhuri
Assistant Examiner—Ourmazd Ojan
Attorney, Agent, or Firm—Miriam Jackson

[57] ABSTRACT

Silicon and non-silicon semiconductor devices are fabricated on a single chip by bonding a silicon wafer to a non-silicon semiconductor substate. Portions of the non-silicon semiconductor substrate are selectively etched to expose the silicon wafer. Semiconductor devices may then be formed in the silicon wafer and on the non-silicon semiconductor substrate. Alternatively, selective epitaxial silicon may be grown where the non-silicon semiconductor substrate was removed. In another embodiment, a non-silicon semiconductor substrate having wells formed therein is bonded to a silicon wafer. The non-silicon semiconductor substrate is then polished until openings are provided to the silicon wafer. Further processing is carried out as described above.

14 Claims, 1 Drawing Sheet

METHOD OF FABRICATING INTEGRATED SILICON AND NON-SILICON SEMICONDUCTOR DEVICES

BACKGROUND OF THE INVENTION

This invention relates, in general, to semiconductor devices, and more particularly, to integrated silicon and non-silicon semiconductor devices fabricated on a single chip.

High density electronic devices, such as logic or memory devices, are typically fabricated on silicon, while optical or microwave devices are fabricated on non-silicon semiconductor materials for optimization and cost reasons. It would be desirable to be able to fabricate these devices on a single chip in order to obtain multiple functionality. If both of these types of devices were built on silicon or on a non-silicon semiconductor material, optimum device characteristics may be sacrificed. Thus, it would be desirable to be able to cost effectively integrate the silicon and non-silicon materials on a single chip in order to fabricate integrated silicon and non-silicon devices on a single chip.

In the past, this integration has been obtained by growing an epitaxial gallium arsenide layer onto a silicon semiconductor substrate. Integrated silicon and non-silicon semiconductor devices may thus be fabricated in this manner. However, many defects are formed in the epitaxial gallium arsenide layer due to lattice mismatch of the gallium arsenide and the silicon. Thus, devices built in the gallium arsenide epitaxial layer exhibit poor performance. In addition, a high cost of growing gallium arsenide epitaxial layers prohibits the use of this method.

Accordingly, it is an object of the present invention to provide an improved method of integrating silicon and non-silicon semiconductor devices on a single chip.

Another object of the present invention is to provide a method of forming integrated silicon and non-silicon semiconductor devices by wafer bonding, selective etching, and selective epitaxial growth.

A further object of the present invention is to provide a method of integrating silicon and non-silicon semiconductor devices wherein the non-silicon semiconductor is of high quality.

Yet another object of the present invention is to provide a method of integrating silicon and non-silicon semiconductor devices by bonding a well etched non-silicon semiconductor substrate with a silicon wafer.

Still another object of the present invention is to provide a method of integrating silicon and non-silicon semiconductor devices by bonding a silicon wafer having semiconductor devices fabricated therein to a non-silicon semiconductor substrate.

SUMMARY OF THE INVENTION

The above and other objects and advantages of the present invention are achieved by bonding a silicon wafer to a non-silicon semiconductor substrate. A silicon wafer is bonded to a non-silicon semiconductor substrate wafer either directly or through an intermediate layer. The thickness of the non-silicon semiconductor substrate is then reduced by mechanical polishing or chemical/mechanical polishing. Portions of the non-silicon semiconductor substrate are then etched to expose the silicon wafer. Semiconductor devices may then be formed in the silicon wafer and in the non-silicon semiconductor substrate. Semiconductor devices also could have been formed in the silicon wafer prior to bonding. Interconnects may be formed to electrically connect the devices in the silicon wafer and in the non-silicon semiconductor substrate. Alternatively, silicon may be selectively grown in the areas where the non-silicon semiconductor substrate was removed. Then, devices may be formed in the selectively grown silicon and in the non-silicon semiconductor substrate. In another embodiment, a non-silicon semiconductor substrate having wells formed therein is bonded to a silicon wafer. The non-silicon semiconductor substrate is then polished until openings are provided to the silicon wafer. Further processing is carried out as described above.

DETAILED DESCRIPTION OF THE DRAWINGS

Figure 1:
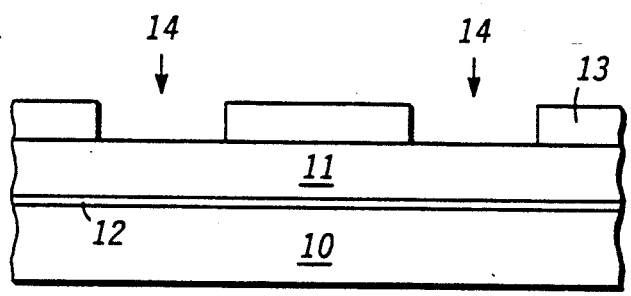
FIGS. 1-2 illustrate enlarged, cross-sectional views of a first embodiment of the present invention in various stages of fabrication.

FIG. 1 illustrates an enlarged, cross-sectional view of a first embodiment of the present invention in a beginning stage of fabrication. What is shown is a silicon wafer 10, with a non-silicon semiconductor substrate 11 bonded on silicon wafer 10 with an intermediate or stress-relief layer 12 between them. Bonding may be accomplished by methods disclosed in a related patent application, entitled, "A Non-silicon and Silicon Bonded Structure and Method of Manufacture," having an Attorney Docket No. SC06908P, which is hereby incorporated by reference. Other suitable means of bonding may also be used. Bonding may be accomplished without intermediate layer 12.

A masking layer 13 is formed on the surface of non-silicon semiconductor substrate 11, and thereafter is patterned to provide openings 14. Silicon wafer 10 may be comprised of a silicon substrate, or a substrate having an epitaxial layer formed thereon. Silicon wafer 10 may also have semiconductor devices formed therein before bonding to non-silicon semiconductor substrate 11. Non-silicon substrate 11 is preferably a III-V compound semiconductor substrate, such as a gallium arsenide substrate. FIG. 1 shows non-silicon semiconductor substrate 11 (not to scale) already thinned or polished to a predetermined thickness after bonding by using mechanical means such as grinding or lapping, or chemical/mechanical means to reduce the thickness of non-silicon semiconductor substrate 11 to preferably approximately 2 to 50 microns. Semiconductor devices, (not shown) may be formed in non-silicon layer 11 before masking layer 13 is formed. Masking layer 13 may be comprised of a photoresist layer or a silicon dioxide or silicon nitride. Openings 14 are formed in masking layer 13 by conventional methods. If masking layer 13 is a silicon nitride or a silicon dioxide, then a photoresist layer (not shown) is used to form openings 14.

Figure 2:
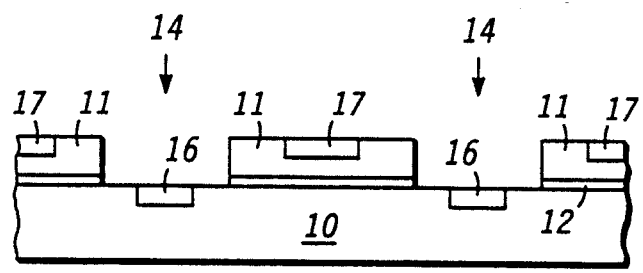

FIG. 2 illustrates the structure of FIG. 1 further along in processing. Non-silicon substrate 11 and intermediate layer 12 are etched in openings 14 down to silicon wafer 10. A wet or dry etch, which selectively etches gallium arsenide and not silicon, may be used. A different etch may have to be used to remove intermediate layer 12, depending on what it is comprised of. In one embodiment, semiconductor devices 16 may be formed in silicon wafer 10. Alternatively, silicon wafer 10 may have devices 16 already fabricated in openings 14 prior to bonding to non-silicon semiconductor substrate 11. Non-semiconductor devices 17 may then be fabricated in non-silicon semiconductor substrate 11 by removing masking layer 13 and protecting exposed silicon layer 10. Interconnections (not shown) between the devices fabricated on silicon wafer 10 and non-silicon semiconductor substrate 11 are then fabricated. The structure shown in FIG. 2 illustrates a non-planar structure for integrating semiconductor devices 16 and 17 formed in silicon wafer 10 and in non-silicon semiconductor substrate 11. Semiconductor devices 16 and 17 are simply illustrated as single regions for illustrative convenience only. It should be understood that semiconductor devices 16 and 17 can be any semiconductor devices or circuits.

Figure 3:
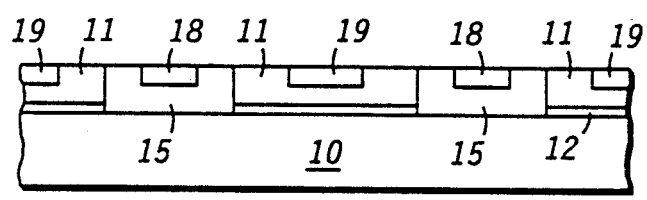
FIG. 3 illustrates an enlarged, cross-sectional view of a second embodiment of the present invention.

FIG. 3 illustrates the structure of FIG. 2 after openings 14 are formed to expose silicon wafer 10, but before devices 16 are formed and further along in processing. FIG. 3 illustrates a planar structure for integrating silicon and non-silicon semiconductor devices, in contrast to the structure shown in FIG. 2. First, a selective epitaxial silicon layer 15 is formed in openings 14, utilizing silicon wafer 10 as a seed. This is done by conventional methods. Semiconductor devices 18 and semiconductor devices 19 may then be formed in selective epitaxial silicon layer 15 and in non-silicon semiconductor substrate 11, respectively. Masking layer 13 is removed to fabricate devices in non-silicon semiconductor substrate 11.

Figure 4:
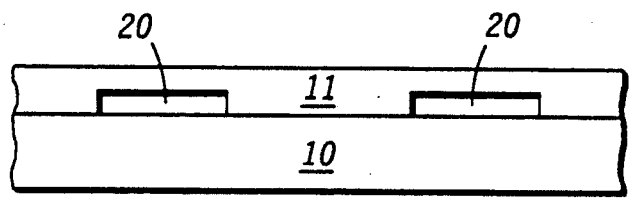
FIGS. 4-5 illustrate enlarged, cross-sectional views of a third embodiment of the present invention in various stages of fabrication.
Figure 5:
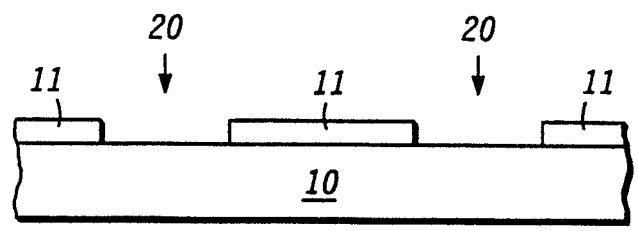

FIG. 4 illustrates a third embodiment of the present invention in a beginning stage of fabrication. In this case, a silicon wafer 10 is bonded to an etched non-silicon semiconductor substrate 11. An intermediate layer (not shown) may also be used here. Portions of non-silicon semiconductor substrate 11 are removed or etched to form wells 20 prior to bonding, using conventional methods. An advantage of using this process is that wells 20 provide stress relief during bonding. FIG. 5 illustrates the structure of FIG. 4 further along in processing. Non-silicon substrate 11 is polished using mechanical or chemical/mechanical methods at least until wells 20 are reached to expose silicon wafer 10. Wells 20 then become openings 20. Further processing may be done to obtain structures as described in FIGS. 2 and 3.

As can be readily seen, the integrated silicon and non-silicon semiconductor devices of the present invention utilize a non-silicon semiconductor substrate rather than a non-silicon semiconductor epitaxial layer. A gallium arsenide substrate has less defects than an epitaxial gallium arsenide. Thus, devices formed in the gallium arsenide substrate exhibit better performance and higher yields than those formed in an epitaxial gallium arsenide layer. In addition, the cost of forming an epitaxial gallium arsenide layer is not incurred. An intermediate layer may be used between the silicon wafer and the non-silicon semiconductor substrate if desired. A well structure or a planar structure may be formed as desired. By utilizing the present invention, high quality non-silicon semiconductor devices and silicon devices may be formed on a single chip.

We claim:

1. A method of fabricating integrated silicon and non-silicon semiconductor devices, comprising the steps of:
   providing a silicon wafer;
   bonding a non-silicon semiconductor substrate to the silicon wafer;
   thinning down the non-silicon semiconductor substrate to a desired thickness; and
   removing portions of the non-silicon semiconductor substrate to expose portions of the silicon wafer.

2. The method of claim 1 further comprising forming semiconductor devices in the non-silicon semiconductor substrate after removing portions of the non-silicon semiconductor substrate.

3. The method of claim 2 wherein the silicon wafer has semiconductor devices formed therein.

4. The method of claim 2 further comprising forming semiconductor devices in the silicon wafer.

5. The method of claim 1 further comprising forming semiconductor devices in the non-silicon semiconductor substrate before removing portions of the non-silicon semiconductor substrate.

6. The method of claim 1 further comprising the step of selectively growing silicon on the silicon wafer where portions of the non-silicon semiconductor substrate were removed.

7. The method of claim 6 further comprising forming semiconductor devices in the selectively grown silicon and in the non-silicon semiconductor substrate.

8. The method of claim 1 wherein an intermediate layer is positioned between the silicon wafer and the non-silicon semiconductor substrate and further comprising removing portions of the intermediate layer to expose portions of the silicon wafer.

9. The method of claim 1 wherein the non-silicon semiconductor substrate is a gallium arsenide substrate.

10. The method of claim 1 wherein the non-silicon semiconductor substrate has wells formed on the surface bonded to the silicon wafer and wherein the non-silicon semiconductor substrate is thinned at least to the wells, to expose the silicon wafer.

11. A method of making an integrated silicon and non-silicon device, comprising the steps of
   providing a silicon wafer;
   bonding a non-silicon semiconductor substrate to the silicon wafer, wherein the non-silicon semiconductor substrate has wells formed therein on the surface which is bonded to the silicon wafer; and
   thinning down the non-silicon semiconductor substrate to at least the wells.

12. The method of claim 11 further comprising the step of selectively growing silicon on the exposed silicon wafer.

13. The method of claim 12 further comprising forming semiconductor devices in the selectively grown silicon and in the non-silicon semiconductor substrate.

14. The method of claim 11 wherein an intermediate layer is positioned between the silicon wafer and the non-silicon semiconductor substrate and further comprising removing portions of the intermediate layer to expos portions of the silicon wafer.

* * * * *